US012727366B2

(12) United States Patent
Shin et al.

(10) Patent No.: US 12,727,366 B2
(45) Date of Patent: Sep. 1, 2026

(54) ELECTROLUMINESCENT DISPLAY DEVICE

(71) Applicant: LG DISPLAY CO., LTD., Seoul (KR)

(72) Inventors: JooHwan Shin, Goyang-si (KR); MinJoo Kang, Seoul (KR); HeeSuk Pang, Paju-si (KR); Heechul Lim, Paju-si (KR); Suk Yang, Paju-si (KR)

(73) Assignee: LG Display Co., Ltd. (KR)

( * ) Notice: Subject to any disclaimer, the term of this patent is extended or adjusted under 35 U.S.C. 154(b) by 343 days.

(21) Appl. No.: 18/218,830

(22) Filed: Jul. 6, 2023

(65) Prior Publication Data

US 2024/0023412 A1 Jan. 18, 2024

(30) Foreign Application Priority Data

Jul. 13, 2022 (KR) ........................ 10-2022-0086244

(51) Int. Cl.
*H10K 59/80* (2023.01)
*H10K 59/122* (2023.01)

(52) U.S. Cl.
CPC ......... *H10K 59/873* (2023.02); *H10K 59/122* (2023.02); *H10K 59/8722* (2023.02); *H10K 59/874* (2023.02)

(58) Field of Classification Search
CPC ............... H10K 59/873; H10K 59/122; H10K 59/8722; H10K 59/874; H10K 50/844; H10K 50/11; H10K 50/82; H10K 50/8426; H10K 50/846; H10K 59/124
See application file for complete search history.

(56) References Cited

U.S. PATENT DOCUMENTS 10,608,207 B2 * 3/2020 Ju ........................ H10K 85/631
2020/0168683 A1 * 5/2020 Son ........................ H10K 77/10
2020/0403180 A1 12/2020 Seon et al.
2022/0123263 A1 4/2022 Song et al.
(Continued)

FOREIGN PATENT DOCUMENTS

JP 2010135182 A 6/2010
JP 2018109962 A 7/2018
JP 2018124816 A 8/2018
(Continued)

OTHER PUBLICATIONS

Japanese Office Action dated May 7, 2024 issued in Patent Application No. 2023-112747 w/English Translation.
(Continued)

*Primary Examiner* — Elmito Breval
(74) *Attorney, Agent, or Firm* — Fish & Richardson P.C.

(57) ABSTRACT

An electroluminescent display device includes a substrate including an active area and a non-active area which encloses the active area, a planarization layer which is disposed on the substrate and extends from the active area to the non-active area, a bank over the planarization layer, an organic layer over the bank, a cathode over the organic layer, a trench pattern which is disposed in the non-active area and the cathode and the organic layer are removed and a step relieving layer which fills the trench pattern and is disposed to planarize an upper portion of the trench pattern to delay a moisture permeation speed from the side surface, thereby improving the reliability and reducing the bezel width at the same time.

20 Claims, 12 Drawing Sheets

(56) References Cited

U.S. PATENT DOCUMENTS

| | | | | |
|---|---|---|---|---|
| 2022/0149320 | A1 | 5/2022 | Yang et al. | |
| 2022/0209185 | A1* | 6/2022 | Kim | H10K 77/10 |

FOREIGN PATENT DOCUMENTS

| | | | |
|---|---|---|---|
| JP | 2018205744 | A | 12/2018 |
| JP | 2019181815 | A | 10/2019 |
| JP | 2021077620 | A | 5/2021 |
| JP | 2022070849 | A | 5/2022 |
| KR | 10-2020-0090595 | A | 7/2020 |
| KR | 10-2022-0061416 | A | 5/2022 |
| KR | 20220056107 | A | 5/2022 |
| KR | 10-2023-0102982 | A | 7/2023 |

OTHER PUBLICATIONS

Office Action in Korean Appln. No. 10-2022-0086244, mailed on Dec. 31, 2025, 6 pages (with English translation).

* cited by examiner

ELECTROLUMINESCENT DISPLAY DEVICE

CROSS-REFERENCE TO RELATED APPLICATION

This application claims the priority of Korean Patent Application No. 10-2022-0086244 filed on Jul. 13, 2022, which is hereby incorporated by reference in its entirety.

BACKGROUND

Field of the Disclosure

The present disclosure relates to an electroluminescent display device, and more particularly, to an electroluminescent display device with a narrow bezel.

Description of the Background

Currently, as it enters a full-scale information era, the field of a display device which visually expresses electrical information signals has been rapidly developed, and studies are continued to improve performances of various display devices such as a thin-thickness, a light weight, and a low power consumption.

As representative display devices, there are a liquid crystal display (LCD) device, an electro-wetting display (EWD) device, and an organic light emitting display (OLED) device.

Among them, an electroluminescent display device including the organic light emitting display device is a self-emitting display device so that a separate light source is not necessary, which is different from the liquid crystal display device. Therefore, the electroluminescent display device may be manufactured to have a light weight and a small thickness. Further, since the electroluminescent display device is advantageous not only in terms of power consumption due to a low voltage driving, but also in terms of color implementation, a response speed, a viewing angle, a contrast ratio (CR), it is expected to be utilized in various fields.

SUMMARY

The present disclosure is to provide an electroluminescent display device which reduces a bezel width by locating a trench pattern in a shadow area that is converted into a reliable bezel area.

The present disclosure is also to provide an electroluminescent display device which improves device reliability by suppressing a lifting phenomenon of a cathode adjacent to the trench pattern.

The present disclosure is also to provide an electroluminescent display device which increases rigidity of the display panel and improves a heat dissipation effect.

The present disclosure is not limited to the above-mentioned features, and other advantages, which are not mentioned above, may be clearly understood by those skilled in the art from the following descriptions.

In an aspect of the present disclosure, an electroluminescent display device includes a substrate including an active area and a non-active area which encloses the active area, a planarization layer which is disposed on the substrate and extends from the active area to the non-active area, a bank over the planarization layer, an organic layer over the bank, a cathode over the organic layer, a trench pattern which is disposed in the non-active area and the cathode and the organic layer are removed and a step relieving layer which fills the trench pattern and is disposed to planarize an upper portion of the trench pattern.

Other detailed matters of the exemplary aspects are included in the detailed description and the drawings.

According to the present disclosure, a trench pattern in which a part of a cathode and an organic layer is removed is formed in an unnecessary shadow area which is generated by using the deposition mask to reduce the bezel width and improve the reliability of a performance of suppressing the moisture permeation.

Further, according to the present disclosure, even though a lifting phenomenon that a part of the cathode disposed in an area adjacent to the trench pattern is separated from the organic layer occurs, the separated space is filled with a step relieving layer. Therefore, the reliability of the electroluminescent display device is improved by relieving the step of the inorganic layer disposed thereabove.

Further, according to the present disclosure, an encapsulation structure of a plurality of layers structure including a relatively thick reinforcement substrate is introduced to sufficiently ensure the rigidity and the heat dissipation effect. Further, the step relieving layer which fills and covers the trench pattern improves the adhesiveness of the encapsulation structure of the plurality of layers structure and may improve the durability of the electroluminescent display device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
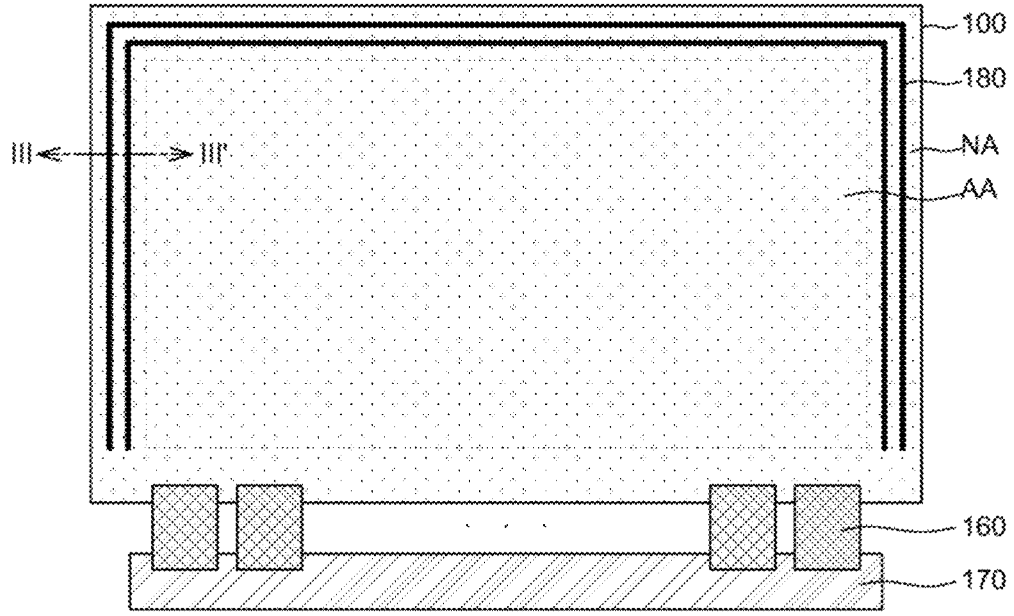
FIG. 1 is a plan view of an electroluminescent display device according to an exemplary aspect of the present disclosure.

Advantages and characteristics of the present disclosure and a method of achieving the advantages and characteristics will be clear by referring to exemplary aspects described below in detail together with the accompanying drawings.

However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

Hereinafter, an electroluminescent display device according to exemplary aspects of the present disclosure will be described in detail with reference to accompanying drawings.

FIG. 1 is a plan view of an electroluminescent display device according to an exemplary aspect of the present disclosure.

Referring to FIG. 1, the electroluminescent display device of the exemplary aspect of the present disclosure may include a display panel 100, a flexible film 160, a printed circuit board 170, and a trench pattern 180.

The display panel 100 is a panel for displaying images to a user. In the display panel 100, a display element which displays images, a driving element which drives the display element, and wiring lines which transmit various signals to the display element and the driving element may be disposed.

The display element may be defined in different ways depending on a type of the display panel 100. For example, when the display panel 100 is an organic light emitting display panel, the display element may be an organic light emitting diode which includes an anode, an organic light emitting layer, and a cathode. For example, when the display panel 100 is a liquid crystal display panel, the display element may be a liquid crystal display element.

Hereinafter, even though the display panel 100 is assumed as an organic light emitting display panel, the display panel 100 is not limited to the organic light emitting display panel.

The display panel 100 may include an active area AA and a non-active area NA as shown in FIG. 1. The active area AA is an area where images are displayed in the display panel 100, and the non-active area NA is an area where no image is displayed.

In the active area AA, a plurality of sub pixels which constitute the plurality of pixels and a circuit for driving the plurality of sub pixels may be disposed. The plurality of sub pixels is minimum units which configure the active area AA and a display element may be disposed in each of the plurality of sub pixels. The plurality of sub pixels may configure a pixel. For example, an organic light emitting diode which includes an anode, an organic light emitting layer, and a cathode may be disposed in each of the plurality of sub pixels, but it is not limited thereto. Further, a circuit for driving the plurality of sub pixels may include a driving element and a wiring line. For example, the circuit may be configured by a thin film transistor, a storage capacitor, a gate line, and a data line, but is not limited thereto.

FIG. 1 shows that the non-active area NA encloses a quadrangular active area AA. However, shapes and placements of the active area AA and the non-active area NA are not limited to the example illustrated in FIG. 1.

In other words, the active area AA and the non-active area NA may have various shapes suitable for a design of an electronic device mounted with the electroluminescent display device. For example, an exemplary shape of the active area AA may be a pentagon, a hexagon, a circle, or an oval, etc.

In the non-active area NA, various wiring lines and circuits for driving the organic light emitting diode of the active area AA may be disposed. For example, in the non-active area NA, a link line which transmits signals to the plurality of sub pixels and circuits of the active area AA or a driving IC such as a gate driver IC or a data driver IC may be disposed, but it is not limited thereto.

The electroluminescent display device may further include various additional elements to generate various signals or drive the pixel in the active area AA. The additional elements for driving the pixels may include an inverter circuit, a multiplexer, or an electro-static discharge (ESD) circuit. The electroluminescent display device may also include an additional element associated with a function other than a pixel driving function. For example, the electroluminescent display device may include additional elements which provide a touch sensing function, a user authentication function (for example, fingerprint recognition), a multilevel pressure sensing function, or a tactile feedback function. The above-mentioned additional elements may be located in the non-active area NA and/or an external circuit which is connected to the connecting interface.

The flexible film 160 may include a flexible base film on which various components are disposed. Specifically, the flexible film 160 is a film which supplies signals to the plurality of sub pixels and the circuits of the display area AA and may be electrically connected to the display panel 100. The flexible film 160 is disposed at one end of the nondisplay area NA of the display panel 100 to supply a power voltage or a data voltage to the plurality of sub pixels and the circuits of the display area AA. The number of flexible films 160 may vary depending on the design, and is not limited thereto.

In the meantime, for example, a driving IC such as a gate driver IC and a data driver IC may be disposed on the flexible film 160. The driving IC is a component which processes data for displaying images and a driving signal for processing the data. The driving IC may be disposed by a chip on glass (COG), a chip on film (COF), or a tape carrier package (TCP) depending on a mounting method.

The printed circuit board 170 is disposed at one end of the flexible film 160 to be connected to the flexible film 160. The printed circuit board 170 is a component which supplies signals to the driving IC. The printed circuit board 170 may supply various signals such as a driving signal and a data signal to the driving IC. For example, a data driving unit which generates data signals may also be mounted in the printed circuit board 170, and the generated data signals may be supplied to the plurality of sub pixels and the circuit of the display panel 100 through the flexible film 160. The number of printed circuit boards 170 may vary depending on the design, and is not limited thereto.

In the meantime, in the electroluminescent display device, to ensure the reliability such as suppression of moisture permeation, a minimum bezel distance is necessary. Further, in accordance with a demand for the slim display device, a demand for a slimness of the non-active area NA of the display device excluding the active area AA in which the images is disposed is also increasing. At this time, when the cathode and the organic layer are deposited, a shadow area may be generated by a gap between the mask and the substrate so that it is limited to reduction of the bezel.

In the exemplary aspect of the present disclosure, a trench pattern 180 in which parts of the cathode and the organic layer are removed may be disposed in the shadow area in the non-active area NA. Therefore, in the exemplary aspect of the present disclosure, a moisture permeation speed onto a side surface of the display panel 100 may be delayed by the trench pattern 180. As described above, the shadow area can be converted into a reliable bezel area, thus reducing a bezel width.

The trench pattern 180 may be formed over the non-active areas NA at three sides of the display panel 100 excluding one side of the display panel 100 in which the flexible film 160 is disposed. That is, as illustrated in FIG. 1, the trench pattern 180 may be disposed over three side portions in which the flexible film 160 is not disposed, among four side portions of the display panel 100, but is not limited thereto. In FIG. 1, a lower side of the display panel 100 in which a driving IC is disposed and a voltage is applied is likely to be damaged by the laser so that the trench pattern 180 may not be formed, but is not limited thereto.

The trench pattern 180 may be formed by removing the cathode and the organic layer of the shadow area at the outside of the active area AA, for example, by laser ablation. Therefore, the reliable bezel area is enlarged and the bezel width can be reduced as much as the length of the added reliable bezel area.

The trench pattern 180 may extend to the planarization layer and the bank which are moisture permeation paths, below the cathode and the organic layer, by a photo process, but is not limited thereto.

The trench pattern 180 will be described in more detail with reference to FIGS. 2 and 3.

Figure 2:
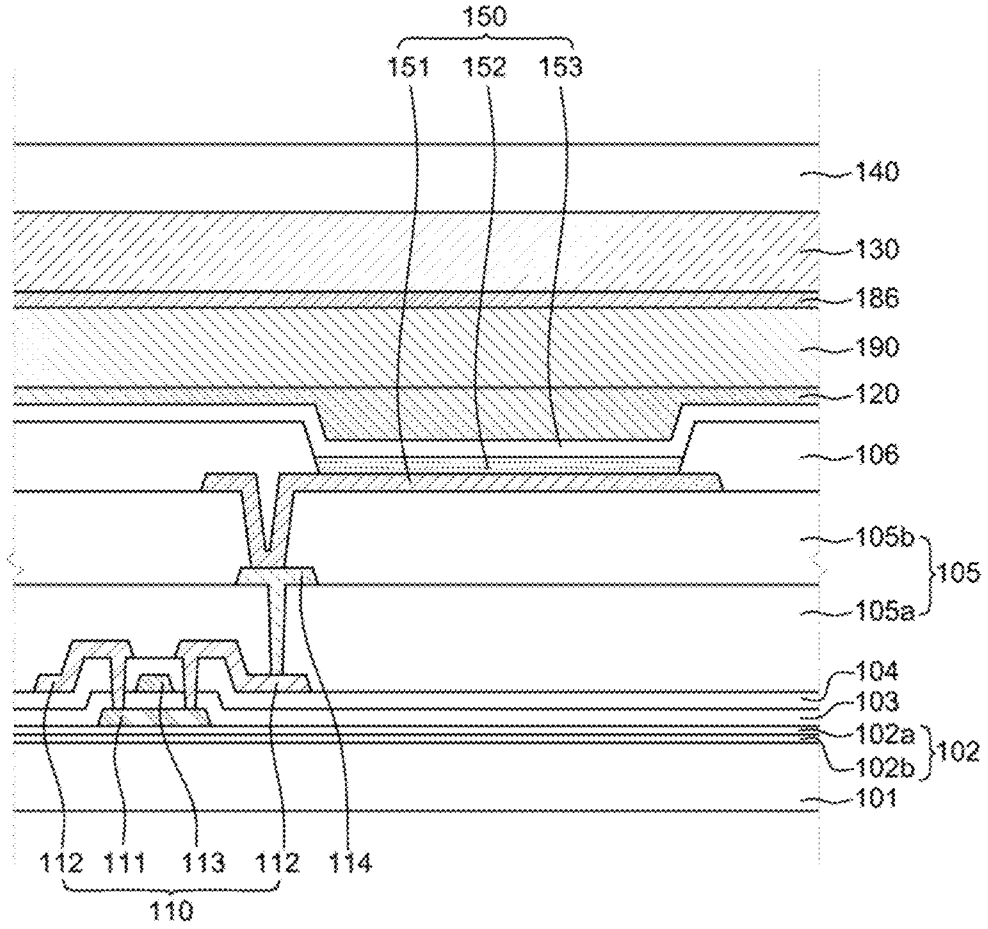
FIG. 2 is a cross-sectional diagram of a sub pixel of an electroluminescent display device according to an exemplary aspect of the present disclosure.

FIG. 2 is a cross-sectional view of a sub pixel of an electroluminescent display device according to an exemplary aspect of the present disclosure. FIG. 3 is a cross-sectional view taken along line III-III' of FIG. 1.

More specifically, FIG. 2 is a cross-sectional view of one sub pixel of a display panel 100 according to an exemplary aspect of the present disclosure. FIG. 3 illustrates a cross-section of a left side of side portions of the display panel 100 in which the trench pattern 180 is formed. For the convenience of description, in FIG. 2, a pixel unit 115 in the active area AA is schematically illustrated and in FIG. 3, a gate in panel (GIP) unit 125 in the non-active area NA is schematically illustrated.

Figure 3:
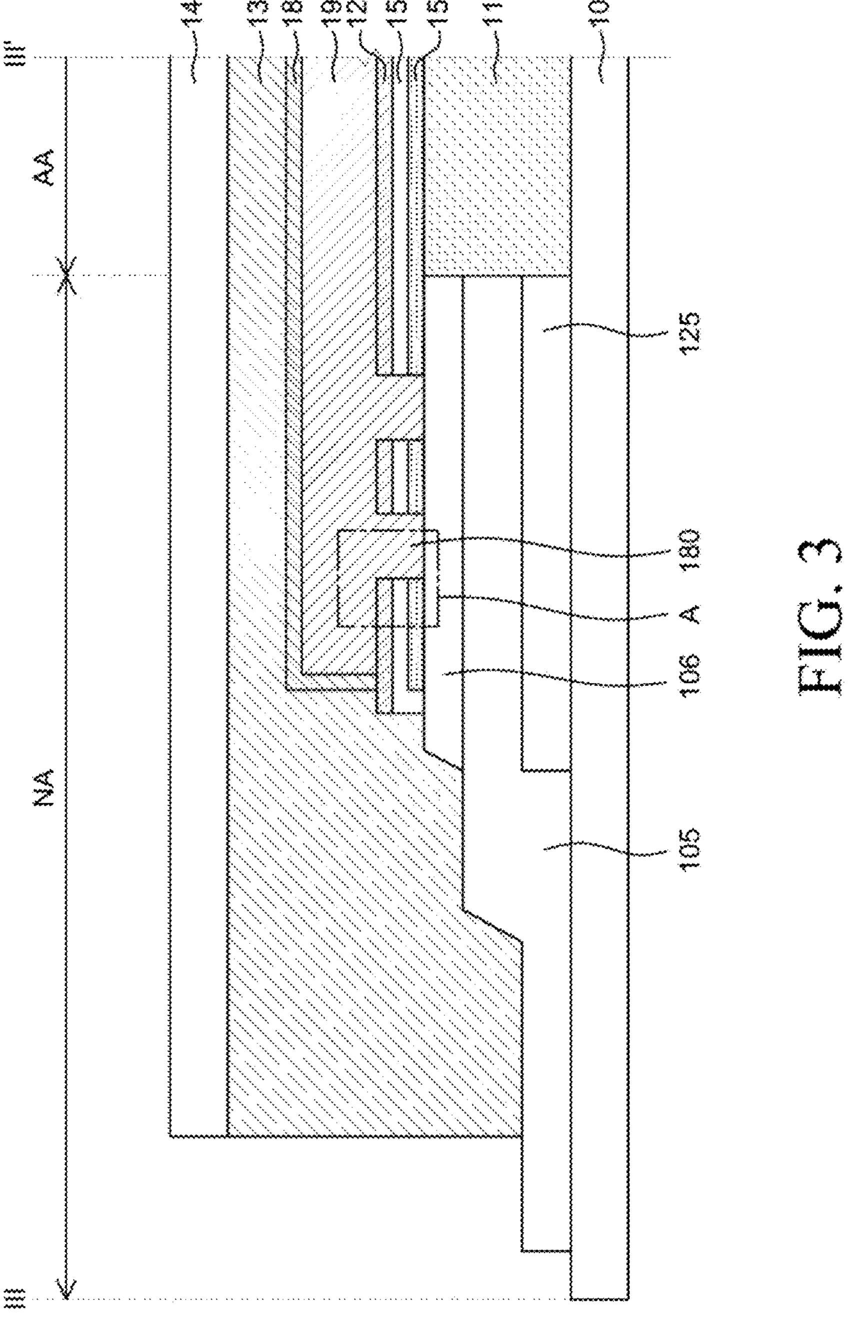
FIG. 3 is a cross-sectional view taken along line III-III' of FIG. 1.

Collectively referring to FIGS. 2 and 3, in the display panel 100 according to an exemplary aspect of the present disclosure, a driving element 110 may be disposed on the substrate 101.

A planarization layer 105 may be disposed on the driving element 110.

Further, an organic light emitting diode 150 which is electrically connected to the driving element 110 is disposed on the planarization layer 105, and a capping layer 120, a step relieving layer 190, and an inorganic layer 186 are disposed on the organic light emitting diode 150 to suppress oxygen and moisture from permeating into the organic light emitting diode 150.

An adhesive layer 130 and an encapsulation substrate 140 may be sequentially disposed on the inorganic layer 186. However, the display panel 100 according to the exemplary aspect of the present disclosure is not limited to this laminated structure.

The substrate 101 may be a glass or plastic substrate. When the substrate 101 is a plastic substrate, polyimide based or polycarbonate based materials are used so that the substrate may have a flexibility. Specifically, polyimide may be applied to a high temperature process and is a coatable material so that polyimide may be frequently used for the plastic substrate.

A buffer layer 102 may be disposed on the substrate 101. The buffer layer 102 is a functional layer which protects various electrodes and wiring lines from impurities such as alkali ions leaked from the substrate 101 or layers therebelow and may have a plurality of layers structure which is formed by a first buffer layer **102*a* and a second buffer layer 102*b*, but is not limited thereto. The buffer layer 102** may be formed of silicon oxide (SiOx), silicon nitride (SiNx), or a plurality of layers thereof.

The buffer layer 102 may delay the diffusion of moisture and/or oxygen which permeates through the substrate 101. The buffer layer 102 may include a multi buffer and/or an active buffer. The active buffer may perform a function of protecting an active layer 111 of the driving element 110 configured by a semiconductor and blocking various types of defects introduced from the substrate 101. The active buffer may be formed of amorphous silicon (a-Si).

The driving element 110 may be formed by sequentially disposing an active layer 111, an insulating layer 103, a gate electrode 113, a gate insulating layer 104, a source electrode and a drain electrode 112 and is electrically connected to the organic light emitting diode 150 via the connection electrode 114. Therefore, the driving element 110 may transmit a current or signal to the organic light emitting diode 150.

The active layer 111 may be located on the buffer layer 102. The active layer 111 may be made of poly silicon (p-Si). In this case, a predetermined region may also be doped with impurities. Further, the active layer 111 may also be formed of amorphous silicon (a-Si) or various organic semiconductor materials such as pentacene. Moreover, the active layer 111 may be formed of oxide.

The insulating layer 103 may be located on the active layer 111. The insulating layer 103 may be formed of an insulating inorganic material such as silicon oxide (SiOx) or silicon nitride (SiNx) or may also be formed of an insulating organic material.

The gate electrode 113 may be located on the insulating layer 103. The gate electrode 113 may be formed of various conductive materials, for example, magnesium (Mg), aluminum (Al), nickel (Ni), chrome (Cr), molybdenum (Mo), tungsten (W), gold (Au), or an alloy thereof.

The gate insulating layer 104 may be disposed on the gate electrode 113. The gate insulating layer 104 may be formed of an insulating material such as silicon oxide (SiOx) and silicon nitride (SiNx), and besides, may also be formed of other insulating organic material.

The insulating layer 103 and the gate insulating layer 104 are selectively removed to form a contact hole through which the source and drain regions are exposed. The source electrode and the drain electrode 102 may be formed of a material for an electrode, on the gate insulating layer 104, as a single layer or a plurality of layers structure. If necessary, an additional passivation layer which is configured with an inorganic insulating material may be formed to cover the source electrode and drain electrode 112.

A planarization layer 105 may be disposed on the driving element 110 configured as described above.

The planarization layer 105 may have a plurality of layers structure configured by at least two layers and for example, as illustrated in FIG. 2, may include a first planarization layer 105*a* and a second planarization layer 105*b*. The first planarization layer 105*a* is disposed to cover the driving element 110, but to expose a part of the source electrode and the drain electrode 112 of the driving element 110.

The planarization layer 105 may extend to the non-active area NA to cover a GIP unit 125.

A thickness of the planarization layer 105 may be approximately 2 μm, but is not limited thereto.

The planarization layer 105 may be an overcoat layer, but is not limited thereto.

The planarization layer 105 may be disposed to be spaced apart from an end of the substrate 101 with a predetermined distance, but is not limited thereto.

The connection electrode 114 may be disposed on the first planarization layer 105*a* to electrically connect the driving element 110 and the organic light emitting diode 150. Further, even though not illustrated in FIG. 2, various metal layers which serve as electric wires/electrodes such as a data line or a signal line may also be disposed on the first planarization layer 105*a*.

Further, the second planarization layer 105*b* may be disposed on the first planarization layer 105*a* and the connection electrode 114. In the display panel 100 according to the exemplary aspect of the present disclosure, the planarization layer 105 is configured by two layers because as the resolution of the display panel 100 is increased, various signal lines are increased. Therefore, it is difficult to dispose all the wiring lines on one layer while ensuring a minimum interval so that an additional layer is provided. The additional layer (the second planarization layer 105*b*) is added so that there is a margin for disposing wiring lines, which may make it easier to design to dispose the electric wires/electrodes. Further, when a dielectric material is used for the planarization layer 105 configured by a plurality of layers, the planarization layer 105 may be utilized to form a capacitance between metal layers.

The second planarization layer 105*b* may be formed to expose a part of the connection electrode 114 and the drain electrode 112 of the driving element 110 and the anode 151 of the organic light emitting diode 150 may be electrically connected by the connection electrode 114.

The organic light emitting diode 150 may be configured by sequentially disposing the anode 151, the plurality of organic layers 152, and the cathode 153. That is, the organic light emitting diode 150 may be configured by the anode 151 formed on the planarization layer 105, the organic layer 152 formed on the anode 151, and the cathode 153 formed on the organic layer 152.

The electroluminescent display device may be implemented as a top emission type or a bottom emission type. In the case of the top emission type, a reflective layer may be added below the anode 151 to allow light emitted from the organic layer 152 to be reflected by the anode 151 to be directed upwardly, that is, directed to the cathode 153 thereabove. The reflective layer may be formed of an opaque conductive material having a high reflectance, such as silver (Ag), aluminum (Al), gold (Au), molybdenum (Mo), tungsten (W), chrome (Cr), and an alloy thereof. In contrast, in the case of the bottom emission type, the anode 151 may be only formed of a transparent conductive material, such as indium tin oxide (ITO), indium zin oxide (IZO), and indium gallium zinc oxide (IGZO). Hereinafter, it is assumed that the display panel 100 of the present disclosure is a bottom emission type.

The bank 106 may be formed in a remaining area excluding the emission area on the planarization layer 105. Therefore, the bank 106 has a bank hole which exposes the anode 151 corresponding to the emission area. The bank 106 may be formed of an inorganic insulating material, such as silicon nitride (SiNx) and silicon oxide (SiOx), or an organic insulating material, such as BCB, acrylic resin and imide resin.

The bank 106 may extend to the non-active area NA.

A thickness of the bank 106 may be approximately 1 μm, but is not limited thereto.

The bank 106 may cover an upper portion of the GIP unit 125, but is not limited thereto.

The organic layer 152 may be disposed on the anode 151 exposed by the bank 106. The organic layer 152 may include an emission layer, an electron injection layer, an electron transport layer, a hole transport layer, and a hole injection layer.

The organic layer 152 may extend to the non-active area NA.

The organic layer 152 may be disposed on the bank 106 in the non-active area NA.

The cathode 153 may be disposed on the organic layer 152.

In the case of the top emission type, the cathode 153 may include a transparent conductive material. For example, the cathode 153 may be formed of indium tin oxide (ITO), indium zin oxide (IZO), or indium gallium zinc oxide (IGZO). In the case of the bottom emission type, the cathode 153 may include metal materials such as gold (Au), silver (Ag), aluminum (Al), molybdenum (Mo), magnesium (Mg), palladium (Pd), copper (CU), and an alloy thereof. Alternatively, the cathode 153 may also be configured by laminating a layer formed of a transparent conductive layer such as indium tin oxide (ITO), indium zinc oxide (IZO), and indium gallium zinc oxide (IGZO) or a layer formed of a metal material such as gold (Au), silver (Ag), aluminum (Al), molybdenum (Mo), magnesium (Mg), palladium (Pd), copper (CU), and an alloy thereof, but is not limited thereto.

The cathode 153 may extend to the non-active area NA. The cathode 153 is spaced apart from the end of the bank 106 with a predetermined distance to be in contact with a part of the top surface of the bank 106.

The cathode 153 may be disposed to cover the side surface of the organic layer 152 in the non-active area NA. The organic layer 152 may be disposed to be spaced apart from an end of the cathode 153 with a predetermined distance, but is not limited thereto.

A part of the cathode 153 which is adjacent to the trench pattern 180 may be disposed to be spaced apart from the organic layer 152. A shape of the cathode 153 will be described in more detail below with reference to FIGS. 4A and 4B.

The capping layer 120 which is formed of a material having a high refractive index and a high light absorptance may be disposed on the organic light emitting diode 150 to reduce scattered reflection of external light.

The capping layer 120 may be an organic layer formed of an organic material and may be omitted as needed.

The capping layer 120 may extend to the non-active area NA. The capping layer 120 may be disposed on the cathode 153 in the non-active area NA.

In the display panel 100 according to the exemplary aspect of the present disclosure, the trench pattern 180 from which the capping layer 120, the cathode 153, and the organic layer 152 are removed may be disposed. The trench pattern 180 may be disposed in the shadow area between ends of the cathode 153 in the non-active area NA at the outside of the active area AA.

The trench pattern 180 may be formed by removing the capping layer 120, the cathode 153, and the organic layer 152 of the shadow area at the outside of the active area AA, for example, by laser ablation. As described above, the planarization layer 105 and the bank 106 may be removed by the photo process and by doing this, the trench pattern 180 may extend, but is not limited thereto.

When a width of the laser is 50 m, the trench pattern 180 may have a width of approximately 70 m, but is not limited thereto. It is considered a width (~20 m) of an area affected by the laser heat.

Even though in FIG. 3, it is illustrated that two trench patterns 180 are provided, it is not limited thereto. That is, one trench pattern 180 or two or more trench patterns may be provided and it is not limited to the number of trench patterns 180 illustrated in FIG. 3. Further, a passivation layer for protecting the GIP unit 125 from the laser ablation may be further disposed on the bottom of the trench pattern 180, but is not limited thereto.

When laser having an ultraviolet region with wavelength range of approximately 266 nm is used, the passivation layer may be formed of a transparent conductive material which is the same material as the material constituting the anode 151 to absorb 100% of laser. The transparent conductive material may include indium tin oxide (ITO), indium zinc oxide (IZO), or indium gallium zinc oxide (IGZO).

The step relieving layer 190, the inorganic layer 186, the adhesive layer 130, and the encapsulation substrate 140 may be disposed on the capping layer 120 and the trench pattern 180.

First, the step relieving layer 190 may be disposed on the capping layer 120 and may be disposed to fill the trench pattern 180. The step relieving layer 190 is disposed to fill up the trench pattern 180 to relieve the step caused by the trench pattern 180 and may planarize an upper portion of the trench pattern 180. Further, the step relieving layer 190 may protect the organic light emitting diode 150 of the pixel unit 115 from moisture, oxygen, and impacts of the outside together with the capping layer 120, the inorganic layer 186, and the encapsulation substrate 140.

As shown in FIG. 3, the inorganic layer 186 may be disposed on the top and side surfaces of the step relieving layer 190, so that the inorganic layer 186 is in contact with the top surface of the capping layer 120.

The step relieving layer 190 may be formed of an organic material. Specifically, the step relieving layer 190 may include resin formed of an organic material and a getter dispersed in the resin.

The resin of the step relieving layer 190 may be formed of an organic material. For example, the step relieving layer 190 may include epoxy resin, acrylic resin, and silicon oxy carbon (SiOC) resin.

The step relieving layer 190 may include a getter. The getter may be dispersed in the above-mentioned resin. The getter may include one of barium oxide (BaO), calcium oxide (CaO), magnesium oxide (MgO), magnesium sulfate ($MgSO_4$), sodium oxide ($Na_2O$), sodium sulfate ($Na_2SO_4$), lithium sulfate (LiSO), calcium sulfate ($CaSO_4$), potassium oxide ($K_2O$), lithium oxide ($Li_2O$), gallium sulfate (GaS), calcium chloride ($CaCl_2$), magnesium chloride ($MgCl_2$), calcium bromide ($CaBr_2$), cerium bromide (CsBr), vanadium bromide ($VBr_5$), and calcium nitrate ($Ca(NO_3)_2$). The getter may be formed of particles having a size of 50 to 100 nm. The getter may be configured by a transparent material, but is not limited thereto.

The step relieving layer 190 may be implemented by a film. That is, the step relieving layer 190 is not formed by applying and curing a liquid material, but is implemented as a film to be disposed on the capping layer 120. Therefore, the step relieving layer 190 may be implemented by an organic film.

A shape of the step relieving layer 190 will be described in more detail below with reference to FIGS. 4A and 4B.

The inorganic layer 186 which is formed of an inorganic insulating material may be disposed on the step relieving layer 190. The inorganic layer 186 may delay the moisture permeation in the upper portion, and suppress the defect caused by dent or foreign materials.

The inorganic layer 186 may be disposed to be in contact with the top surface of the step relieving layer 190. The inorganic layer 186 may cover the top surface and the side surface of the step relieving layer 190 to seal the step relieving layer 190. When the cathode 153 and the capping layer 120 extend from an end of the step relieving layer 190 to an external surface of the substrate 101, the inorganic layer 186 may be in contact with a part of the top surface of the capping layer 120 disposed on the top surface of the cathode 153.

To delay the moisture permeation, the inorganic layer 186 may be configured by silicon oxide (SiOx), silicon nitride (SiNx), or a plurality of layers thereof, but is not limited thereto.

The adhesive layer 130 may be disposed on the inorganic layer 186. The adhesive layer 130 and the encapsulation layer 140 may extend to the non-active area NA to cover a part of the planarization layer 105 and the bank 106.

The adhesive layer 130 may be disposed to enclose the capping layer 120, the inorganic layer 186, and the pixel unit 115. The adhesive layer 130 may protect the organic light emitting diode 150 of the pixel unit 115 from moisture, oxygen, and impacts of the outside together with the capping layer 120, the inorganic layer 186, and the encapsulation substrate 140.

The adhesive layer 130 may further include an absorbent. The absorbent may be particles having hygroscopicity and absorb moisture and oxygen from the outside to minimize permeation of the moisture and oxygen into the pixel unit 115.

The encapsulation substrate 140 may be disposed above the adhesive layer 130. The encapsulation substrate 140 may protect the organic light emitting diode 150 of the pixel unit 115 together with the adhesive layer 130. The encapsulation layer 140 may protect the light emitting diode 150 from moisture, oxygen, and impacts of the outside.

For example, the encapsulation substrate 140 may be configured by invar which is an iron/nickel alloy, but is not limited thereto. As the encapsulation structure of the present disclosure, a plurality of layers structure including a barrier layer such as a thin metal layer or aluminum foil (Al foil) and a reinforcement substrate such as a plurality of adhesive layers and an aluminum sheet may also be applied.

Hereinafter, a shape of the cathode 153 which is adjacent to the trench pattern 180 will be described in more detail with reference to FIGS. 4A and 4B together.

Figure 4A:
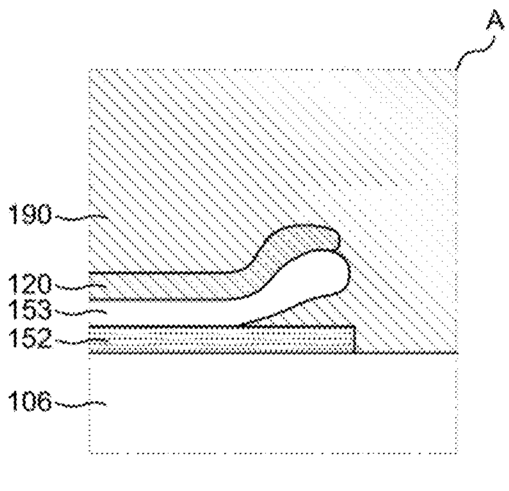
FIGS. 4A and 4B are enlarged cross-sectional views of a region A of FIG. 3.
Figure 4B:
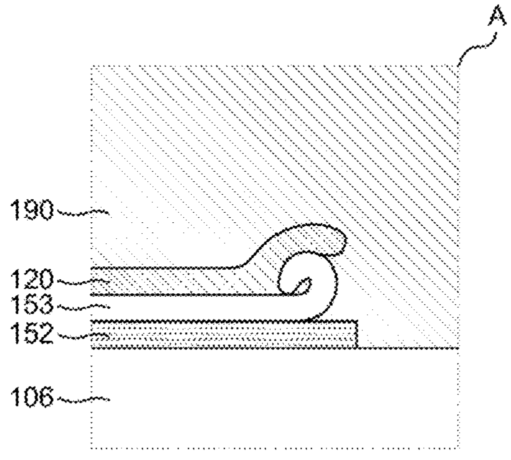

FIGS. 4A and 4B are enlarged cross-sectional views of a region A of FIG. 3.

In FIGS. 4A and 4B, shapes of the cathode 153 and the capping layer 120 in an area adjacent to the trench pattern 180 in the display panel 100 of the exemplary aspect of the present disclosure are exemplarily illustrated.

Referring to FIGS. 4A and 4B, a part of the cathode 153 adjacent to the trench pattern 180 may be disposed to be spaced apart from the organic layer 152. As described above, the trench pattern 180 may be formed by removing the cathode 153 and the organic layer 152 in the shadow area at the outside of the active area AA by laser ablation. At this time, a part of the cathode 153 adjacent to the trench pattern 180 is spaced apart from the organic layer 152 due to the difference of the laser absorptance of the cathode 153 and the organic layer 152 so that the part of the cathode 153 may be rolled or lifted.

For example, referring to FIG. 4A, the cathode 153 may have a shape upwardly protruding in the area adjacent to the trench pattern 180. For example, a part of the cathode 153 adjacent to the trench pattern 180 is bent upwardly so that a swelling shape in an area adjacent to the trench pattern 180 may be given. Therefore, an end of the cathode 153 may be lifted and a part of the cathode 153 may be disposed to be spaced apart from the organic layer 152.

For example, referring to FIG. 4B, a height of the end of the cathode 153 adjacent to the trench pattern 180 may be increased and specifically, the cathode 153 may have a rolled shape. For example, the cathode 153 is spaced apart from the organic layer 152 upwardly and an end of the cathode 153 may have a shape bent to be rolled from an upper direction to the organic layer 152. Therefore, an end of the cathode 153 may be lifted and a part of the cathode 153 may be disposed to be spaced apart from the organic layer 152.

However, a shape of a part of the cathode 153 in an area adjacent to the trench pattern 180 is not limited to those illustrated in FIGS. 4A and 4B, but may have various shapes.

Referring to FIGS. 3, 4A, and 4B, the step relieving layer 190 is disposed above the cathode 153 to fill the trench pattern 180. That is, the step relieving layer 190 may cover a side surface of the cathode 153 and a side surface of the organic layer 152 with a step formed as the trench pattern 180 is formed. Further, the step relieving layer 190 fills the separated space between the cathode 153 and the organic layer 152 to cover the rolled or protruding shape of the cathode 153. That is, as illustrated in FIGS. 4A and 4B, the step relieving layer 190 fills the separated space caused when a part of the cathode 153 adjacent to the trench pattern 180 is spaced apart from the organic layer 152 to planarize upper portions of the cathode 153 and the capping layer 120.

As described above, in accordance with the demand for the slimness of the electroluminescent display device, a demand for the reduction of the non-active area of the electroluminescent display device excluding the active area in which the images is displayed is also increasing. At this time, when the cathode and the organic layer are deposited, a shadow area is caused by a gap between the mask and the substrate so that it is limited to reducing the bezel.

Further, in the electroluminescent display device, to ensure the reliability, such as moisture permeation suppression, a minimum bezel distance is necessary, which may be referred to as a reliable bezel. For example, the reliable bezel may be defined from an end of the upper substrate (encapsulation substrate) to an end of the cathode. Therefore, it is limited to reducing the bezel to ensure the reliable bezel.

Therefore, in the electroluminescent display device according to the exemplary aspect of the present disclosure, to ensure the reliability such as moisture permeation suppression, a trench pattern from which a part of the cathode and the organic layer is removed may be formed in the electroluminescent display device. Therefore, a trench pattern is formed in an unnecessary shadow area which is generated due to the usage of a deposition mask to delay a moisture permeation speed from the side surface, thereby improving the reliability and reducing the bezel width at the same time.

In the meantime, during a forming process of a trench pattern, a laser ablation method may be used to remove the capping layer, the cathode, and the organic layer. However, a part of the cathode adjacent to the trench pattern is spaced apart from the organic layer due to the difference in the laser absorptance of the cathode and the organic layer so that it may be rolled or lifted. For example, in an area adjacent to the trench pattern irradiated with laser, an end of the cathode may upwardly protrude. Specifically, as the area irradiated with the laser becomes larger, a rolled or protruding shape of the cathode may become severe and the lifting between the cathode and the organic layer may also become severe. Therefore, a step may be caused in the area adjacent to the trench pattern due to the cathode, and residuals are generated during the laser irradiating process so that foreign materials may be formed, and an uneven top surface of the cathode is caused so that a quality of a film disposed above the cathode may be degraded. Specifically, when an inorganic layer which delays the moisture permeation is disposed above the cathode, there may be problems in that a seam is generated and the inorganic layer may be damaged by the foreign materials and moisture permeation is caused through the damaged interface. Therefore, it is important to ensure the reliability of a cathode and a film disposed above the cathode during the forming process of a trench pattern.

In the exemplary aspect of the present disclosure, a step relieving layer 190 which is capable of ensuring the step coverage is disposed above the trench pattern 180 to improve a reliability of a performance of suppressing the moisture permeation of the electroluminescent display device. During the forming process of the trench pattern 180, the cathode 153 may be spaced apart from the organic layer 152 disposed therebelow. Therefore, the step relieving layer 190 may fill the trench pattern 180, and fills the separated space between the cathode 153 and the organic layer 152 generated by the laser ablation to relieve a steep step change due to the protruding shape of the cathode 153. Further, the step according to the shape of the end of the cathode 153 is reduced by planarizing an upper portion of the trench pattern 180 to suppress the seam. By doing this, the degradation of a quality of a film disposed above the cathode 153 may be suppressed. When the inorganic layer 186 is disposed above the cathode 153, the flatness of the inorganic layer 186 may be improved. Therefore, the reliability of a performance of suppressing the moisture permeation of the electroluminescent display device may be improved.

Further, according to the exemplary aspect of the present disclosure, the step relieving layer 190 includes a getter to delay the moisture permeation. The getter may absorb the moisture and oxygen flowing into the space of the sealed step relieving layer 190 to suppress the spreading of the moisture. Therefore, the moisture permeation path through a film disposed below the step relieving layer 190 may be controlled.

Figure 5:
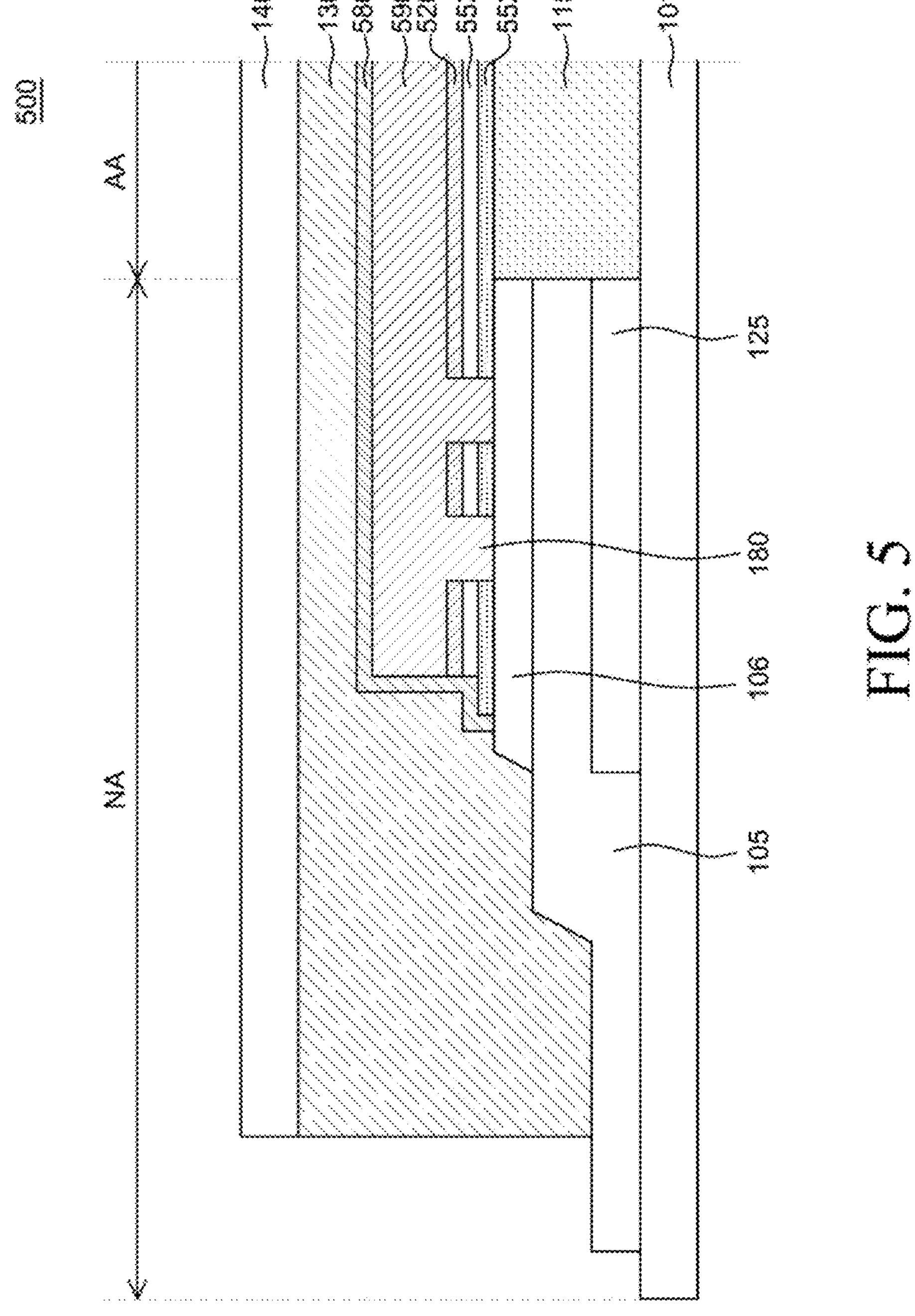
FIG. 5 is a cross-sectional view of an electroluminescent display device according to another exemplary aspect of the present disclosure.

FIG. 5 is a cross-sectional view of an electroluminescent display device according to another exemplary aspect of the present disclosure.

Referring to FIG. 5, as compared with the display panel 100 according to the exemplary aspect of the present disclosure of FIG. 3, only configurations of an organic layer 552, a cathode 553, a capping layer 520, a step relive layer 590, and an inorganic layer 586 of a display panel 500 of an electroluminescent display device according to another exemplary aspect of the present disclosure are different from the aspect of the present disclosure of FIG. 3. Therefore, redundant descriptions the same configurations will be omitted.

Referring to FIG. 5, the organic layer 552 (152 in FIG. 2) disposed in the active area AA may be disposed on the anode 151 exposed by the bank 106 as shown in FIG. 2. The organic layer 552 extends to the non-active area NA to be disposed on the bank 106 in the non-active area NA.

The cathode 553 may be disposed on the organic layer 552. The cathode 553 may be disposed to overlap with a part of the organic layer 552. For example, the cathode 553 may be disposed at the inside of the end of the organic layer 552 to expose a part of a top surface of the organic layer 552.

The cathode 553 may have a rolled or protruding shape in an area adjacent to the trench pattern 180. For example, a part of the cathode 553 may have a bent shape upwardly or rolled shape in an area adjacent to the trench pattern 180. Therefore, a part of the cathode 553 may be disposed to be spaced apart from the organic layer 552.

The capping layer 520 may be disposed on the cathode 553. The capping layer 520 may extend to the non-active area NA and may be disposed to overlap with the cathode 553. For example, when the cathode 553 is disposed at the inside of the end of the organic layer 552, the capping layer 520 may also be disposed at the inside of the end of the organic layer 552.

In the electroluminescent display device according to another exemplary aspect of the present disclosure shown in FIG. 5, the trench pattern 180 may be formed in which the capping layer 520, the cathode 552, and the organic layer 552 are removed. The trench pattern 180 may be disposed in the shadow area between ends of the cathode 553 in the non-active area NA at the outside of the active area AA.

The trench pattern 180, for example, may be formed by removing the capping layer 520, the cathode 553, and the organic layer 552 through laser ablation.

The step relieving layer 590 is disposed above the cathode 553 to fill the trench pattern 180. The step relieving layer 590 fills the separated space of the cathode 553 and the organic layer 552 to cover the protruding shape of the cathode 553. The cathode 553 may have a protruding shape in an area adjacent to the trench pattern 180. For example, when the laser ablation method is used to remove the cathode 553 and the organic layer 552, an end of the cathode 553 may upwardly protrude in a laser irradiated area. Therefore, the step relieving layer 590 may cover a side surface of the cathode 553 and a side surface of the organic layer 552 formed as the trench pattern 180 is formed.

The step relieving layer 590 may planarize an upper portion of the trench pattern 180. Therefore, the step relieving layer 590 may maintain the upper portion of the trench pattern 180 flat while filling a wavy surface of the trench pattern 180.

The inorganic layer 586 which is formed of an inorganic insulating material may be disposed on the step relieving layer 590. The inorganic layer 586 may be disposed to be in contact with the top surface of the step relieving layer 590. Further, the inorganic layer 586 may cover the side surface of the step relieving layer 590 to seal the step relieving layer 590. When the ends of the capping layer 520 and the cathode 553 are disposed on the same plane as the end of the step relieving layer 590, the inorganic layer 586 may cover side surfaces of the capping layer 520 and the cathode 553.

When the organic layer 552 extends to an outer side direction of the substrate 101 from the end of the step relive layer 590, a part of the top surface of the organic layer 552 may be exposed. At this time, the inorganic layer 586 may be disposed to be in contact with the exposed part of the top surface of the organic layer 552. Further, the inorganic layer 586 may cover the side surface of the organic layer 552 and may be in contact with a part of the top surface of the bank 106.

The adhesive layer 530 may be disposed on the inorganic layer 586. The adhesive layer 530 and the encapsulation layer 540 may extend to the non-active area NA to cover a part of the planarization layer 105 and the bank 106. The adhesive layer 530 may be disposed to enclose the capping layer 520, the inorganic layer 586, and the pixel unit 115. The adhesive layer 530 may protect the organic light emitting diode of the pixel unit 115 from moisture, oxygen, and impacts of the outside together with the capping layer 520, the inorganic layer 586, and the encapsulation substrate 140.

The encapsulation substrate 540 may be disposed above the adhesive layer 530. The encapsulation substrate 540 may protect the organic light emitting diode of the pixel unit 115 together with the adhesive layer 530. The encapsulation layer 540 may protect the light emitting diode from moisture, oxygen, and impacts of the outside.

In the electroluminescent display device according to the exemplary aspect of the present disclosure, the step relieving layer 590 is disposed above the trench pattern 180 to reduce the step according to a shape of the end of the cathode 553. Therefore, the reliability of a performance of suppressing the moisture permeation of the electroluminescent display device may be improved.

Further, in the electroluminescent display device according to another exemplary aspect of the present disclosure, the inorganic layer 586 may cover a part of the organic layer 552 exposed by the cathode 553 and the capping layer 520 to delay the moisture permeation through the organic layer 552. That is, as the inorganic layer 586 is disposed to seal all the cathode 553, the capping layer 520, and the organic layer 552, the moisture permeation through the side surfaces of the cathode 553, the capping layer 520, and the organic layer 552 may be delayed as much as possible. Therefore, the reliability of a performance of suppressing the moisture permeation of the electroluminescent display device according to another exemplary aspect of the present disclosure may be further improved.

FIGS. 6A to 6E are cross-sectional views sequentially illustrating a manufacturing process of an electroluminescent display device according to an exemplary aspect of the present disclosure.

Figure 6A:
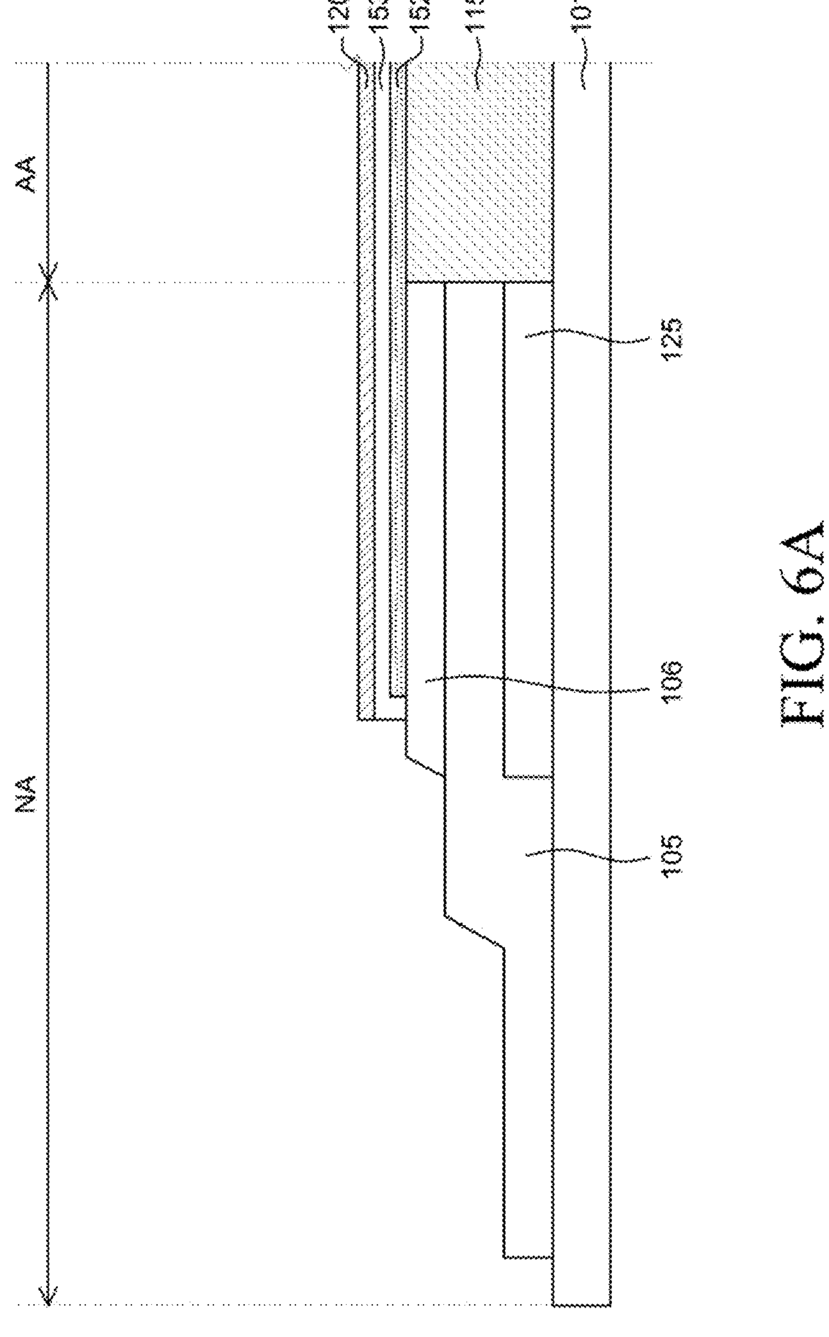
FIGS. 6A to 6E are cross-sectional views sequentially illustrating a manufacturing process of an electroluminescent display device according to an exemplary aspect of the present disclosure.

First, referring to FIG. 6A, various configurations of the pixel unit 115 are formed on the substrate 101 in the active area AA. As described above, the pixel unit 115 is formed in the active area AA of the substrate 101 and may include various configurations below the organic layer 152'.

Further, a GIP unit 125 having various configurations is formed in the non-active area NA of the substrate 101.

Next, the planarization layer 105 which extends to the non-active area NA to cover a GIP unit 125 is formed. The planarization layer 105 may be formed to be spaced apart from an end of the substrate 101 with a predetermined distance, but is not limited thereto.

Next, the bank 106 is formed on the planarization layer 105 in a remaining area excluding the emission area. The bank 106 may be formed to extend to the non-active area NA.

The bank 106 may cover an upper portion of the GIP unit 125, but is not limited thereto.

Next, the organic layer 152', a cathode 153', and a capping layer 120' are sequentially formed above the substrate 101.

Figure 6B:
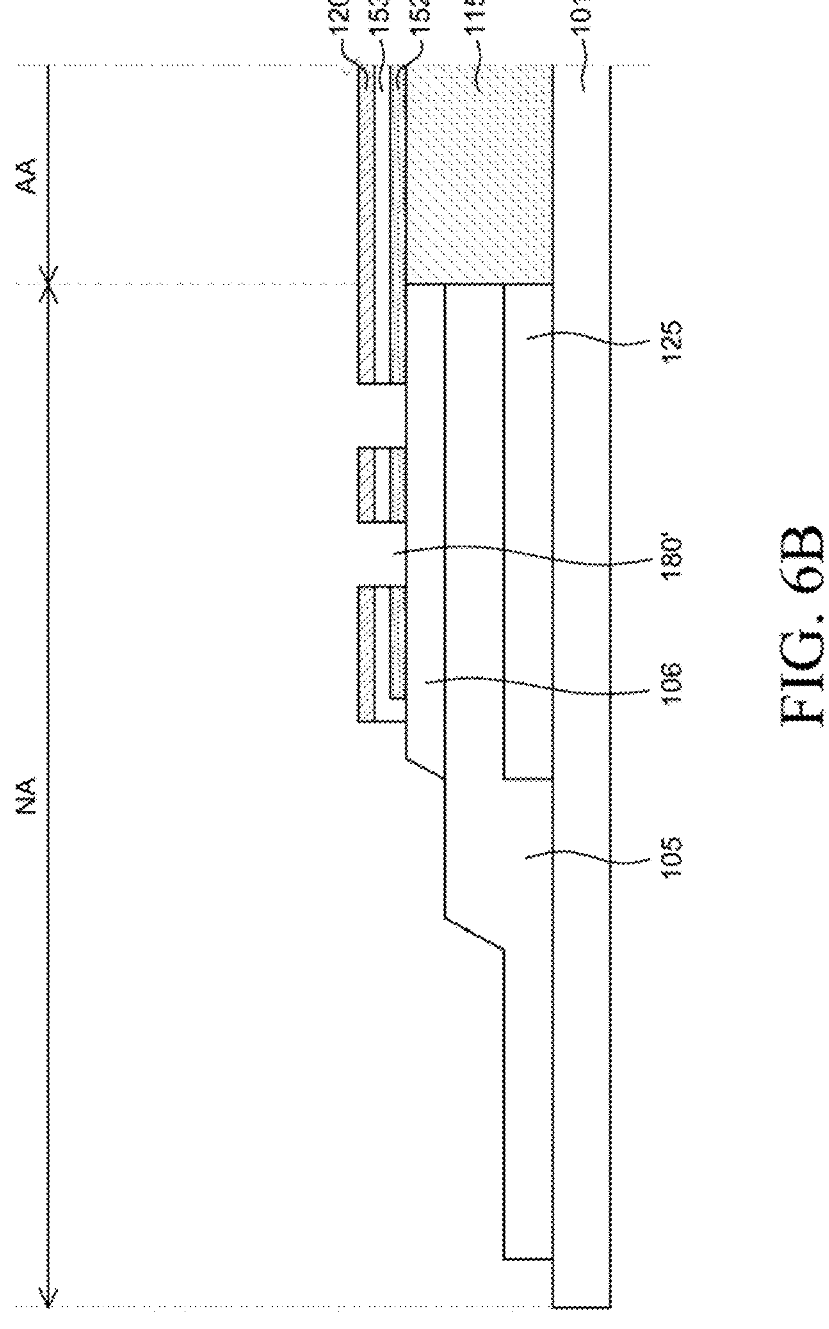

Next, referring to FIG. 6B, partial areas of the capping layer 120', the cathode 153', and the organic layer 152' above the bank 106 formed in FIG. 6A are sequentially removed by irradiating a predetermined laser to form a trench pattern 180'.

The trench pattern 180' may serve to block the moisture permeation through a side surface by removing parts of the organic layer 152', the cathode 153', and the capping layer 120' formed in FIG. 6A. The cathode 153 may have a protruding shape in an area adjacent to the trench pattern 180'. For example, a part of the cathode 153 may be disposed to be spaced apart from the organic layer 152.

Figure 6C:
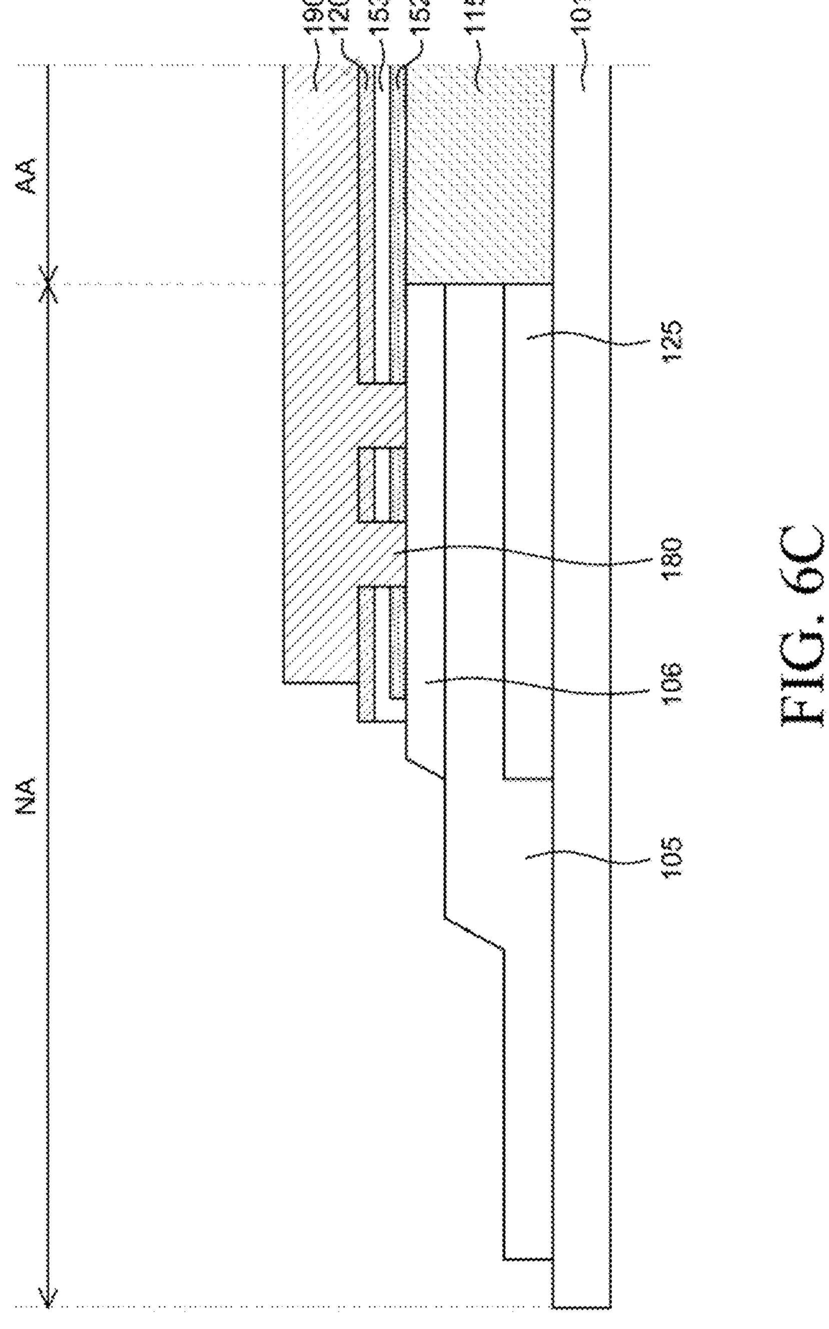

Next, referring to FIG. 6C, the step relive layer 190 is formed on the capping layer 120.

The step relieving layer 190 may fill the trench pattern 180 and cover side surfaces of the organic layer 152, the cathode 153, and the capping layer 120 exposed through the trench pattern 180. For example, when a part of the cathode 153 is spaced apart from the organic layer 152, a separated space between the cathode 153 and the organic layer 152 may be filled.

The step relieving layer 190 may maintain the upper portion of the trench pattern 180 flat while filling the trench pattern 180.

Figure 6D:
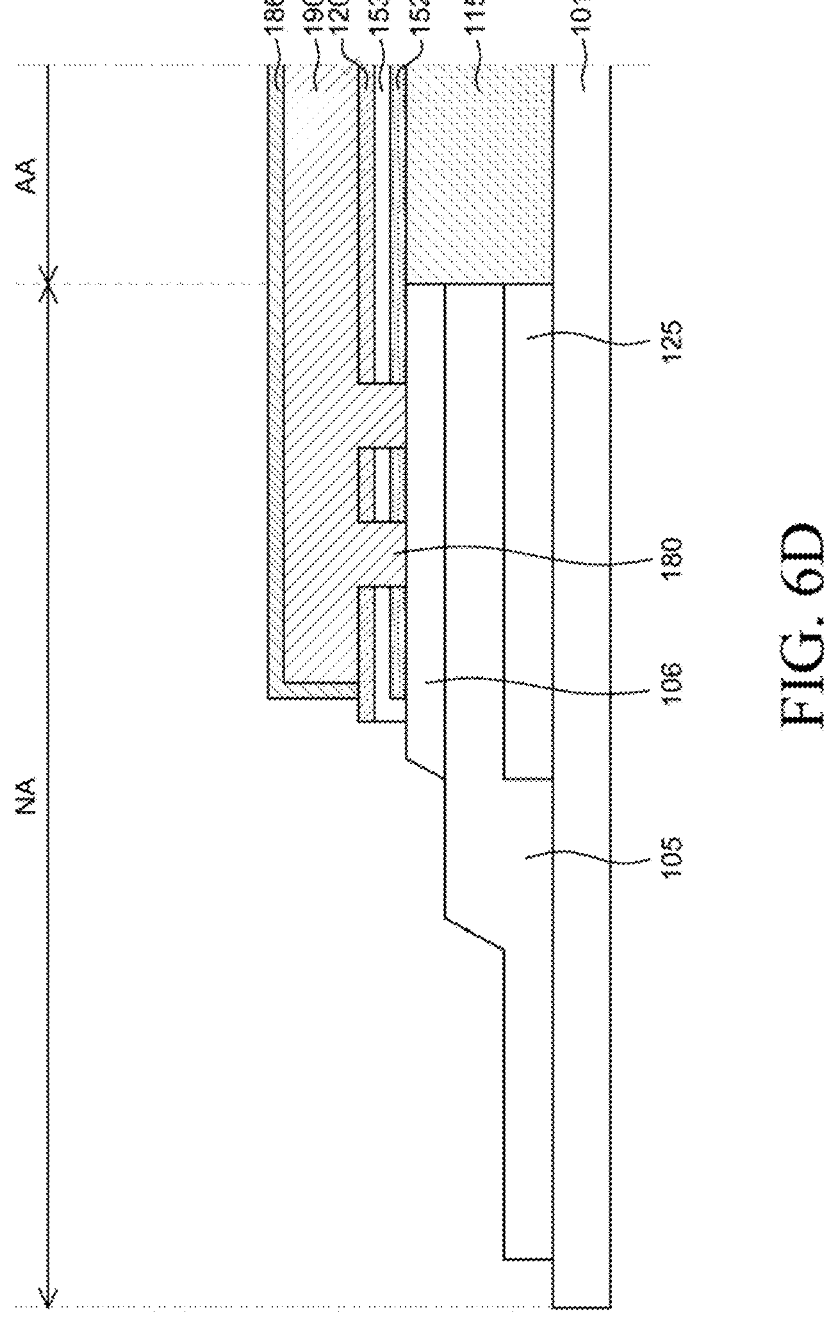

Next, referring to FIG. 6D, the inorganic layer 186 is formed on the step relieving layer 190. The inorganic layer 186 is disposed to be in contact with the top surface of the step relieving layer 190 and may cover the side surface of the step relieving layer 190.

Figure 6E:
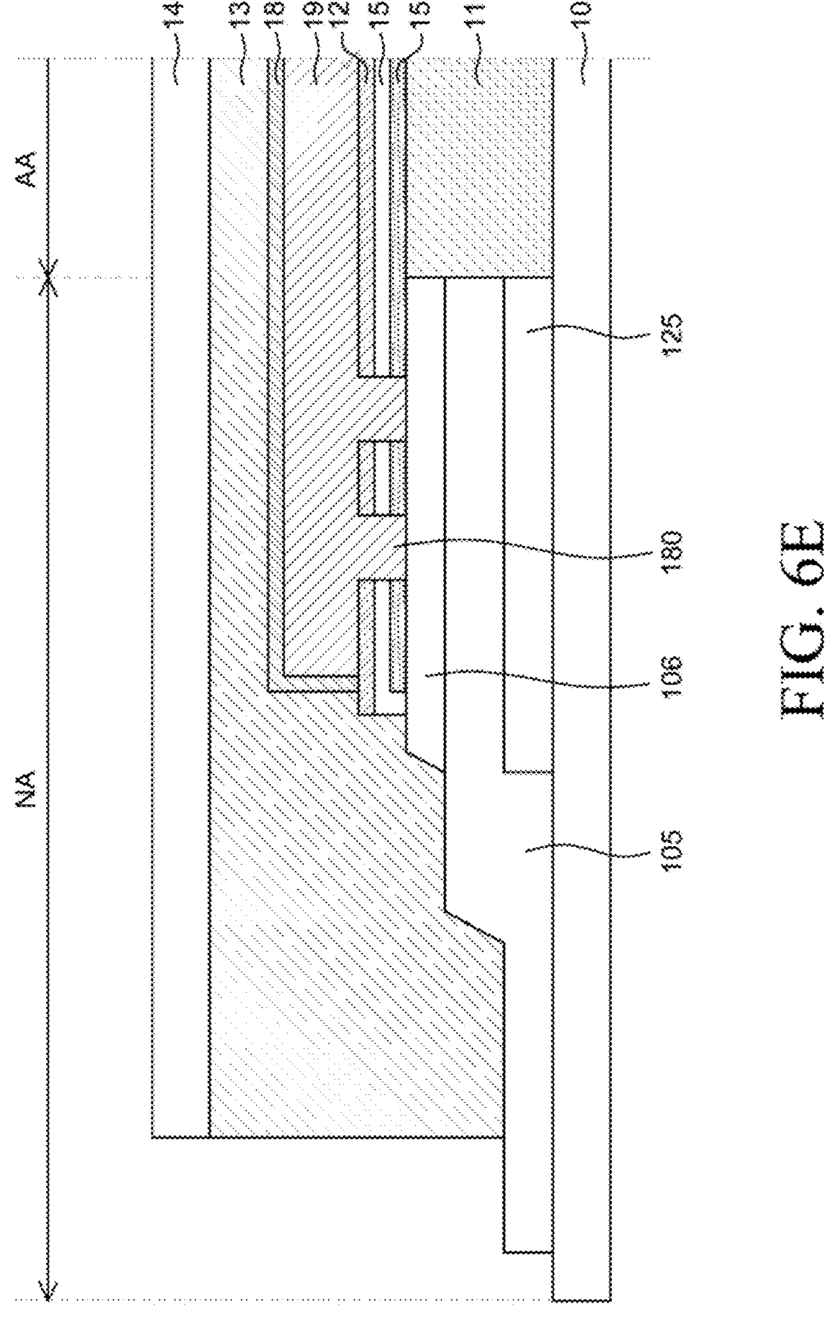

Next, referring to FIG. 6E, an adhesive layer 130 and an encapsulation substrate 140 are sequentially formed on the substrate 101 on which the inorganic layer 186 is formed.

Figure 7:
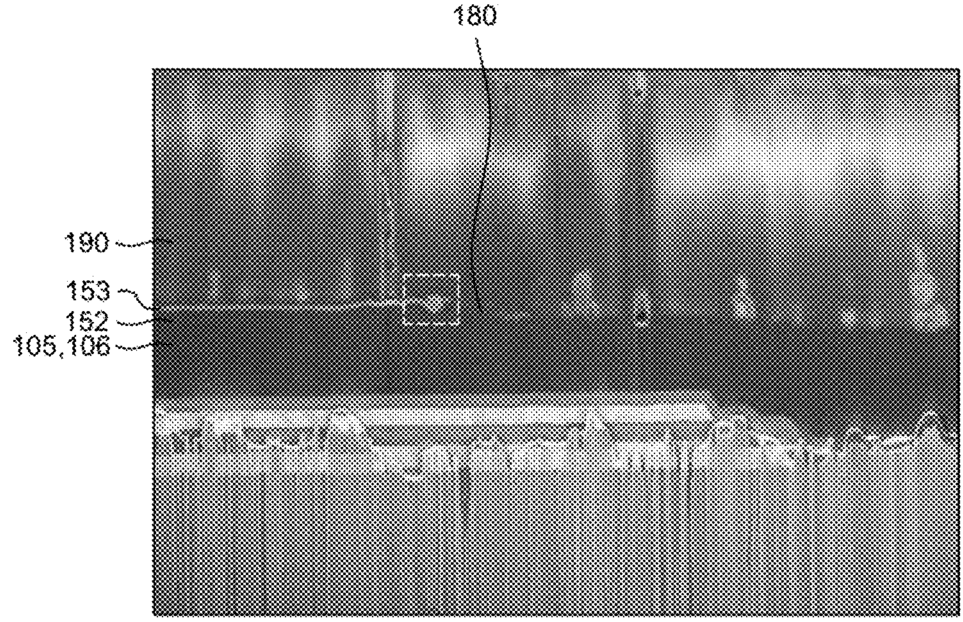
FIG. 7 is a focused ion beam (FIB) analysis image of an electroluminescent display device according to an exemplary aspect of the present disclosure.

FIG. 7 is an FIB analysis image of an electroluminescent display device according to an exemplary aspect of the present disclosure.

An image of FIG. 7 is an FIB analysis image of a trench pattern 180 and an area adjacent to the trench pattern 180 and is an FIB analysis image of an area similar to FIGS. 4A and 4B. In FIG. 7, for the convenience of illustration, only the step relieving layer 190, the cathode 153, the organic layer 152, the planarization layer 105, and the bank 106 are illustrated. Further, a boundary of the planarization layer 105 and the bank 106 is not clearly revealed so that it is indicated by one reference line.

Referring to FIG. 7, when the trench pattern 180 is formed by the laser, a part of the cathode 153 adjacent to the trench pattern 180 which is disposed in an area denoted by a dotted line may be spaced apart from the organic layer 152. Therefore, an end of the cathode 153 may upwardly protrude. Therefore, in an area adjacent to the trench pattern 180, the step may be generated by the cathode 153 and the top surface of the cathode 153 is unevenly formed so that a quality of a film disposed above the cathode 153 may be degraded.

Therefore, in the electroluminescent display device according to the exemplary aspect of the present disclosure, a step relieving layer 190 which is capable of ensuring the step coverage is disposed above the trench pattern 180 to improve a reliability of a moisture permeation suppressing performance of the electroluminescent display device. That is, as confirmed from the image of FIG. 7, the step relieving layer 190 may fill the trench pattern 180 and the separated space between the cathode 153 and the organic layer 152 generated by the laser ablation is filled to relieve a steep step change due to the protruding shape of the cathode. Further, the step according to the shape of the end of the cathode 153 may be reduced by planarizing an upper portion of the trench pattern 180.

In the meantime, as described above, according to the present disclosure, an encapsulation structure with a plurality of layers structure including a barrier layer, such as a thin film of metal layer or an aluminum foil (Al foil) and a reinforcement substrate such as a plurality of adhesive layers and an aluminum sheet may also be applied. That is, according to still another exemplary aspect of the present disclosure, an encapsulation structure with a plurality of layers structure may be introduced above the inorganic layer. The step relieving layer is disposed between an upper portion of the trench pattern and a lower portion of the first adhesive layer of the encapsulation structure with a plurality of layers structure so that the adhesiveness with the encapsulation structure with a plurality of layers structure is improved. Accordingly, a warpage phenomenon may be reduced, and the durability of the electroluminescent display device may be improved. The reinforcement substrate which is a thick metal layer disposed at an upper end of the plurality of layers structure is disposed to cover at least an end of the trench pattern or an end of a step compensation layer to improve the adhesiveness, which will be described with reference to FIG. 8 below.

Figure 8:
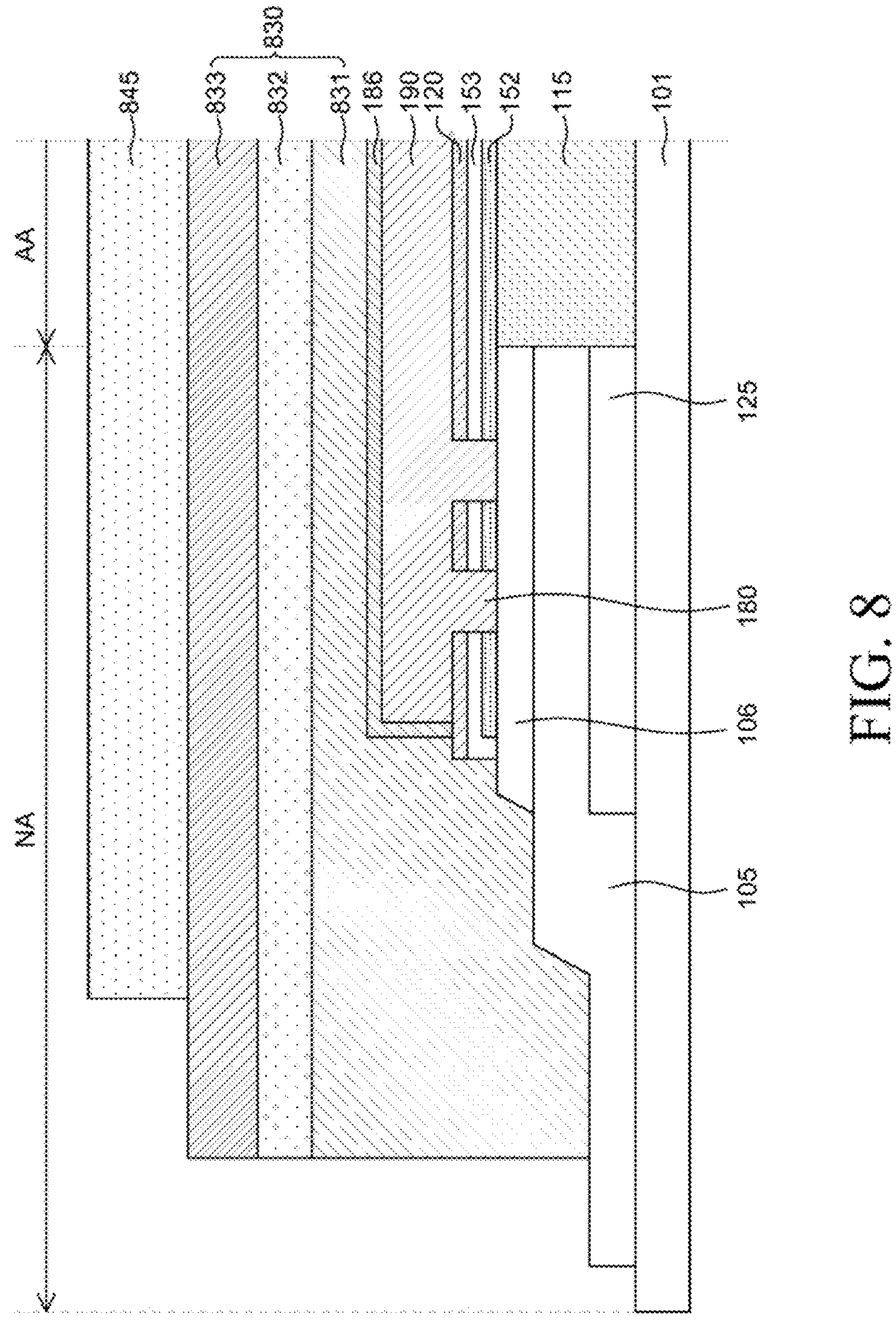
FIG. 8 is a cross-sectional view of an electroluminescent display device according to still another exemplary aspect of the present disclosure.

FIG. 8 is a cross-sectional view of an electroluminescent display device according to still another exemplary aspect of the present disclosure.

As compared with the electroluminescent display device according to the exemplary aspect of the present disclosure of FIG. 3, only configurations of a sealing member 830 and a reinforcement substrate 845 of an electroluminescent display device according to still another exemplary aspect of the present disclosure of FIG. 8 are different. Therefore, the a redundant description for other configurations will be omitted.

Referring to FIG. 8, in the electroluminescent display device according to still another exemplary aspect of the present disclosure, as same as the above-described exemplary aspect, the trench pattern 180 from which the capping layer 120, the cathode 153, and the organic layer 152 are removed may be disposed. The trench pattern 180 may be disposed in the shadow area between ends of the cathode 153 in the non-active area NA at the outside of the active area AA.

The step relieving layer 190 is disposed above the cathode 153 to fill the trench pattern 180. The step relieving layer 190 fills the separated space of the cathode 153 and the organic layer 152 to cover the protruding shape of the cathode 153. The step relieving layer 190 may planarize an upper portion of the trench pattern 180. Therefore, the step relieving layer 190 may maintain the upper portion of the trench pattern 180 flat while filling a wavy surface of the trench pattern 180.

The inorganic layer 186 which is formed of an inorganic insulating material may be disposed above the step relieving layer 190. The inorganic layer 186 may be disposed to be in contact with the top surface of the step relieving layer 190. Further, the inorganic layer 186 may cover the side surface of the step relieving layer 190 to seal the step relieving layer 190.

An encapsulation structure with a plurality of layers structure of the present disclosure may be disposed above the inorganic layer 186. That is, the encapsulation structure with a plurality of layers structure configured by a sealing member 830 and a reinforcement substrate 845 may be disposed above the inorganic layer 186.

In a small sized display panel used for mobile or portable devices, a display panel has a small area so that heat is quickly released from the device and there are few problems in adhesion. However, in a large sized display panel used for monitors, tablets, or television receivers, the display panel has a large area so that an encapsulation structure for optimal heat dissipation effect and adhesion is necessary.

Further, to ensure the insufficient rigidity, the electroluminescent display device may further include a separate inner plate above the encapsulation substrate. In this case, there are problems in that it is necessary to ensure a space for disposing the separate inner plate and it is limited to sliming and lightening the electroluminescent display device due to the weight of the inner plate. Further, the heat dissipation performance is degraded due to an air gap generated by a vertical separated space between the encapsulation substrate and the inner plate as much as a thickness of the adhesive tape disposed to bond the encapsulation substrate and the inner plate.

Therefore, according to another exemplary aspect of the present disclosure, an encapsulation structure with a plurality of layers structure may include the sealing member 830 which fixes a relatively thick reinforcement substrate 845 without the separate inner plate and suppresses the process defect.

The sealing member 830 of the present disclosure may include a first adhesive layer 831 provided to face the substrate 101, a second adhesive layer 833 provided to face the reinforcement substrate 845, and a barrier layer 832 disposed between the first adhesive layer 831 and the second adhesive layer 833.

Each of the first adhesive layer 831 and the second adhesive layer 833 may be formed of a polymer material having adhesiveness. For example, the first adhesive layer 831 may be formed of one of olefin based, epoxy based, and acrylate based polymer materials. The second adhesive layer 833 may be formed of one of olefin based, epoxy based, acrylate based, amine based, phenol based, and acid anhydride based polymer materials which do not contain a carboxyl group, respectively. Specifically, the second adhesive layer 833 is desirably formed of a polymer material which does not contain a carboxyl group for the purpose of film uniformity and corrosion suppression of the barrier layer 832.

to dissipate the heat of the substrate 101, at least the first adhesive layer 831, between the first and second adhesive layers 831 and 833, may be formed of a mixture including an adhesive polymer material and particles of a metal material. For example, the particles of the metal material may be powders formed of nickel (Ni). That is, the first adhesive layer 831 which is in direct contact with the substrate 101 is formed of a mixture including an adhesive polymer material and particles of a metal material so that a thermal conductivity thereof may be higher than that of the adhesive polymer material.

Similarly, the second adhesive layer 833 is also formed of a mixture including an adhesive polymer material and particles of a metal material so that a thermal conductivity thereof may be higher than that of the adhesive polymer material.

By doing this, a speed of releasing a driving heat generated in the substrate 101 through the sealing member 830 may be improved so that a heat dissipation effect to the substrate 101 may be improved.

Further, to suppress the moisture permeation to the pixel unit 115, the first adhesive layer 831 may be formed of a mixture further including a hygroscopic inorganic filler. The hygroscopic inorganic filler may be one of CaO, MgO, and BaO.

Unlike the first adhesive layer 831, the second adhesive layer 833 is not in direct contact with the pixel unit 115 so that it is not necessary to include an inorganic filler for suppressing the moisture permeation of the pixel unit 115. Therefore, the second adhesive layer 833 does not include the hygroscopic inorganic filler, but may include only the adhesive polymer material and particles of the metal material. By doing this, an amount of expensive hydroscopic inorganic filler which is injected into the sealing member 830 is reduced so that a preparing cost for the sealing member 830 may be reduced.

Further, since the hydroscopic inorganic filler is not included, a mixing ratio of the polymer material included in the second adhesive layer 833 may be increased as compared with the first adhesive layer 831. Accordingly, the adhesiveness of the second adhesive layer 833 may be improved more than the adhesiveness of the first adhesive layer 831. Accordingly, as the reinforcement substrate 845 is more firmly fixed onto the second adhesive layer 833, the reliability for the adhesiveness between the substrate 101 and the reinforcement substrate 845 may be further improved. Further, as the first adhesive layer 831 and the second adhesive layer 833 are formed with a plurality of layers structure, a reliability of reducing a warpage phenomenon that the panel is bent is also improved.

A thickness of each of the first and second adhesive layers 831 and 833 may be limited to a threshold or lower which suppresses the process defect. Further, a sum of thicknesses of the first and second adhesive layers 831 and 833 may be limited to a threshold or more to ensure the reliability for fixing the reinforcement substrate 845.

For example, thicknesses of each of the first and second adhesive layers 831 and 833 may be within a range of 10 um to 100 um.

The barrier layer 832 may be formed of any one of a metal material and an inorganic insulating material. That is, the barrier layer 832 may be formed to include a metal material, such as Al, Cu, Sn, Ag, Fe, or Zn. As another example, the barrier layer 832 may be formed of a thin film of an inorganic insulating material, such as SiOx and SiONx.

The barrier layer 832 may be introduced to implement a laminated structure for reinforcing the adhesion with the first and second adhesive layers 831 and 833 and reducing the warpage. Specifically, each of the first and second adhesive layers 831 and 833 are configured to include an adhesive polymer material. Therefore, the barrier layer 832 having a relatively solid material is disposed between the first adhesive layer 831 and the second adhesive layer 833 so that the first adhesive layer 831 and the second adhesive layer 833 are bonded onto one surface and the other surfaces of the barrier layer 832, respectively. Therefore, the adhesiveness may be improved.

A thickness of the barrier layer 832 may be limited to a value smaller than the thickness of the first and second adhesive layers 831 and 833 to minimize the increase in the thickness of the sealing member 830 by the barrier layer 832. For example, the thickness of the barrier layer 832 may be within a range which is larger than 10 um and smaller than thicknesses of each of the first and second adhesive layers 831 and 833.

As described above, the sealing member 830 according to another exemplary aspect of the present disclosure includes the first and second adhesive layers 831 and 833 which are separated by the barrier layer 832 to be implemented with a thickness about twice as large as that of a single-layer adhesive material without process defects. Accordingly, the reinforcement substrate 845 which is fixed by the sealing member 830 may be prepared to have a large thickness so that it is advantageous to easily increase the rigidity and improve a heat dissipation effect. That is, when the thickness of the sealing member 830 is within a range of 30 um to 300 um, the thickness of the reinforcement substrate 845 may be implemented to be a thickness in the range of 0.1 mm to 1.5 mm.

For example, the reinforcement substrate 845 may be formed of any one material of glass, metal, and plastic polymer. For example, the reinforcement substrate 845 may be formed of a metal material including an Al, Cu, Sn, Ag, Fe, or Zn component.

The exemplary aspects of the present disclosure may also be described as follows:

According to an aspect of the present disclosure, there is provided an electroluminescent display device. The electroluminescent display device includes a substrate including an active area and a non-active area which encloses the active area, a planarization layer which is disposed on the substrate and extends from the active area to the non-active area, a bank over the planarization layer, an organic layer over the bank, a cathode over the organic layer, a trench pattern which is disposed in the non-active area and the cathode and the organic layer are removed and a step relieving layer which fills the trench pattern and is disposed to planarize an upper portion of the trench pattern.

The step relieving layer may be implemented by a film.

The step relieving layer may include a getter.

The step relieving layer may further include an epoxy resin, an acrylic resin, and a silicon oxycarbon (SiOC) resin in which the getter may be dispersed.

The electroluminescent display device may further comprise a capping layer disposed between the step relieving layer and the cathode, wherein the capping layer may be removed from the trench pattern area.

The electroluminescent display device may further comprise an inorganic layer over the step relieving layer.

The inorganic layer may be disposed to be in contact with a top surface of the step relieving layer.

The inorganic layer may cover a side surface of the step relieving layer to enclose the step relieving layer.

The inorganic layer may cover a side surface of the capping layer, a side surface of the cathode, and a side surface of the organic layer and an end of the inorganic layer is in contact with a part of the bank.

The organic layer may be disposed to extend to an outer side surface of the substrate from an end of the step relieving layer.

The inorganic layer may be in contact with a part of a top surface of the organic layer.

The cathode may cover a side surface of the organic layer and an end of the cathode may be in contact with a part of a top surface of the bank.

The cathode may be disposed to extend to an outer side surface of the substrate from an end of the step relieving layer.

The inorganic layer may be in contact with a part of a top surface of the capping layer.

The electroluminescent display device may further comprise a flexible film over the substrate at one side of the non-active area, wherein the trench pattern may be disposed in the non-active area at three sides excluding one side of the display panel in which the flexible film is disposed.

A part of the cathode adjacent to the trench pattern may be disposed to be spaced apart from the organic layer.

A part of the cathode adjacent to the trench pattern may be upwardly bent or rolled.

The step relieving layer may fill a separated space between the cathode and the organic layer.

The electroluminescent display device may further comprise a sealing member having a plurality of layers structure and a reinforcement substrate which are disposed above the step relieving layer.

The sealing member may include a first adhesive layer which is disposed above the step reliving layer and provided to face the substrate, a second adhesive layer which is provided to face the reinforcement substrate and a barrier layer disposed between the first adhesive layer and the second adhesive layer.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An electroluminescent display device, comprising:

a base substrate including an active area and a non-active area which surrounds the active area;

a planarization layer disposed on the base substrate and extending from the active area to the non-active area;

a bank disposed over the planarization layer;

an organic layer disposed over the bank;

a cathode disposed over the organic layer;

a trench pattern disposed in the non-active area where the cathode and the organic layer are removed, exposing an upper surface of the bank;

a step relieving layer filling up the trench pattern and planarizing an upper portion of the trench pattern; and an inorganic layer disposed to cover the step relieving layer, wherein the step relieving layer is disposed within a region covered by the inorganic layer.

2. The electroluminescent display device according to claim 1, wherein the step relieving layer includes a film.

3. The electroluminescent display device according to claim 1, wherein the step relieving layer includes a getter.

4. The electroluminescent display device according to claim 3, wherein the step relieving layer further includes one of an epoxy resin, an acrylic resin, and a silicon oxycarbon (SiOC) resin in which the getter is dispersed.

5. The electroluminescent display device according to claim 1, further comprising a capping layer disposed between the step relieving layer.

6. The electroluminescent display device according to claim 1, further comprising an adhesive layer and an encapsulation substrate sequentially disposed on the inorganic layer.

7. The electroluminescent display device according to claim 6, wherein the inorganic layer is in contact with a top surface of the step relieving layer.

8. The electroluminescent display device according to claim 5, wherein the inorganic layer is in contact with a side surface of the step relieving layer.

9. The electroluminescent display device according to claim 8, wherein the cathode covers a side surface of the organic layer and an end of the cathode is in contact with a top surface of the bank.

10. The electroluminescent display device according to claim 9, wherein the cathode extends from an end of the step relieving layer to an outer side surface of the base substrate.

11. The electroluminescent display device according to claim 9, wherein the inorganic layer is in contact with a top surface of the capping layer.

12. The electroluminescent display device according to claim 5, wherein the inorganic layer covers a side surface of the capping layer, a side surface of the cathode and a side surface of the organic layer, and an end of the inorganic layer is in contact with the bank.

13. The electroluminescent display device according to claim 12, wherein the organic layer extends to an outer side surface of the base substrate from an end of the step relieving layer.

14. The electroluminescent display device according to claim 12, wherein the inorganic layer is in contact with a top surface of the organic layer.

15. The electroluminescent display device according to claim 1, further comprising a flexible film over the base substrate at one side of the non-active area, wherein the trench pattern is disposed in the non-active area at three sides excluding one side of the display device in which the flexible film is disposed.

16. The electroluminescent display device according to claim 1, wherein a part of the cathode adjacent to the trench pattern is spaced apart from the organic layer.

17. The electroluminescent display device according to claim 16, wherein a part of the cathode adjacent to the trench pattern is upwardly bent or rolled.

18. The electroluminescent display device according to claim 16, wherein the step relieving layer fills up a separated space between the cathode and the organic layer.

19. The electroluminescent display device according to claim 1, further comprising a sealing member having a plurality of layers and a reinforcement substrate which are disposed above the step relieving layer.

20. The electroluminescent display device according to claim 19, wherein the sealing member includes:

a first adhesive layer disposed on the step relieving layer;

a second adhesive layer disposed on the reinforcement substrate; and a barrier layer disposed between the first adhesive layer and the second adhesive layer.

* * * * *